United States Patent [19]

Sinchok

[11] Patent Number: 4,763,782
[45] Date of Patent: Aug. 16, 1988

[54] CIRCUIT BOARD HOLDER

[75] Inventor: John D. Sinchok, Oconomowoc, Wis.

[73] Assignee: Menasha Corporation, Neenah, Wis.

[21] Appl. No.: 863,313

[22] Filed: May 15, 1986

[51] Int. Cl.⁴ ............................................. B65D 73/02
[52] U.S. Cl. .................................... 206/334; 206/561; 220/22; 220/22.1; 220/22.2
[58] Field of Search .................... 206/328, 334, 561; 220/22, 22.1, 22.2, 22.3; 211/41; 357/70, 69

[56] References Cited

U.S. PATENT DOCUMENTS

| | | | |
|---|---|---|---|
| 1,677,544 | 7/1928 | Brainard et al. | 220/22.3 |
| 2,678,045 | 5/1954 | Erhard | 220/22.3 |
| 2,885,091 | 5/1959 | Van Pelt | 220/22.3 |
| 2,985,333 | 5/1961 | Kirkman | 220/22.3 |
| 3,892,451 | 7/1975 | Bruins | 220/22.3 |
| 3,954,202 | 5/1976 | Petrick | 220/22.3 |
| 4,261,464 | 4/1981 | Maitland | 206/334 |
| 4,362,251 | 12/1982 | Marling | 220/22.3 |
| 4,464,074 | 8/1984 | Green et al. | 403/192 |
| 4,499,997 | 2/1985 | Swingley, Jr. | 220/22.3 |
| 4,502,601 | 3/1985 | Husted et al. | 211/41 |
| 4,506,785 | 3/1985 | Seefeldt | 206/334 |
| 4,527,222 | 7/1985 | Swingley, Jr. | 361/415 |
| 4,593,339 | 6/1986 | Robinson | 206/334 |
| 4,602,715 | 7/1986 | Sarver et al. | 206/561 |

FOREIGN PATENT DOCUMENTS 1077091  11/1954  France ............................ 220/22.3

Primary Examiner—David T. Fidei
Attorney, Agent, or Firm—Quarles & Brady

[57] ABSTRACT

A holder device for printed circuit boards which can be easily accommodated in tote boxes and is particularly suited for the manual placement and removal of the circuit boards. In one embodiment the holder device includes a frame or holder member into which slotted holding members for the circuit boards are received by track members. In another embodiment the holder device is integrally formed with two slotted facing surfaces connected with a common hinge. The holder devices are used as common wall dividers in the tote box and can receive printed circuit boards on both sides thereof. They are attached to the box by flanged ends for insertion into the slotted facings of the tote box wall. Slotted holding members for the circuit boards having varying slot configurations can be readily inserted into the frame members or molded into the integrally formed unit to meet the requirements of the customer.

7 Claims, 4 Drawing Sheets

CIRCUIT BOARD HOLDER

BACKGROUND OF THE INVENTION

This invention relates to an insertable holder device for printed circuit boards such as those which can be placed in tote boxes for automatic or manual handling. More particularly, the invention relates to a printed circuit board holder which requires a minimum number of component parts and is especially suited for manual placement and removal of circuit boards therefrom.

In order to facilitate the handling of the printed circuit boards, circuit board holders are employed in conjunction with container boxes. For example, in U.S. Pat. No. 4,527,222, which is commonly assigned, there is an insert in the form of an inserted frame which is placed in a tote box so as to provide precise locating of the printed circuit board in the frame holding device. While this particular structure affords the precise placement of the printed circuit board for location by automated means such as a robot, in many instances such precise locating is not required such as when a manual placement or removal is conducted. In U.S. Pat. No. 4,502,601 there is described a guide for holding an electronic circuit board between the walls of a housing. It has a specially designed rod-type clamping member mounted on the interior wall of the container for this purpose.

The prior art does not provide a printed circuit board holder which can be efficiently placed inside a tote box and require a minimum number of component parts. Neither does the prior art provide a printed circuit board holder of the foregoing type which can be utilized as a divider plate in a tote box of standard configurations as well as afford a frame-like track structure for divider slots for holding the printed circuit boards with the divider slots having varying slot configurations and sizes so as to customize it to a customer's specific circuit card configuration.

It is an advantage of this invention to provide a printed circuit board holder which can be accommodated in a container box having standard dimensions and configurations and is adjustable.

It is another advantage of this invention to provide a printed circuit board holder which acts as a divider and can receive slotted holders of various dimensions and on both sides of a single divider.

It is still another advantage of this invention to provide a holder of the foregoing type wherein a frame member acts as a divider and has tracks for receiving the slotted holder.

It is a further advantage of this invention to provide a circuit board holder of the foregoing type wherein the holder member is formed from a single molded part with opposed facing panels joined by a common hinge.

It is yet another advantage of this invention to provide a printed circuit board holder of the foregoing type which is especially adapted to having printed circuit boards manually placed therein and removed therefrom.

Other advantages of this invention are the circuit board holder of the foregoing type which can be manufactured from a minimum number of parts; from readily available material; without close tolerances and without extensive tooling.

SUMMARY OF THE INVENTION

The foregoing advantages are accomplished and the shortcomings of the prior art are overcome by the present printed circuit board holder device. The holder includes two holder devices intended to receive the ends of the printed circuit board members or the like in a container box having opposing slots in the side walls. A holder member is of a dimension and has opposing extension portions for positioning in the opposing slots in the side walls. The holder member has a slotted facing surface on both sides of the holder member to receive the circuit board members. In one embodiment, the holder member also has a panel section with opposing track members extending between the extension portions and on at least one side of the panel section. A printed circuit board holding member is constructed and arranged to be positioned in the track members. The track members are positioned on each side of the panel section. The printed circuit board holding member is defined by a plurality of slot members and the track members are defined by grooves provided by a wall portion extending transversely with respect to the panel section and flange portions extending from the wall portion and spaced from the panel section. The flange portions which form a portion of the track member have a thickness in cross section equal to or greater than the thickness of the panel section. In a preferred embodiment, a holder member is fabricated from a unitary molded facing board having two facing panels joined by a hinge. At the opposite ends are tab portions which are sealed together to form the holder member. Reinforcing bars are secured to the inside walls of the facing panels which have the usual slots to receive the printed circuit boards. In another preferred embodiment, the extension portions for the holder member are defined by interconnecting flange members which fit into the holder members.

BRIEF DESCRIPTION OF THE DRAWINGS

A better understanding of the present printed circuit board holder device will be accomplished by reference to the drawings wherein.

DESCRIPTION OF THE PREFERRED EMBODIMENTS

Figure 1:
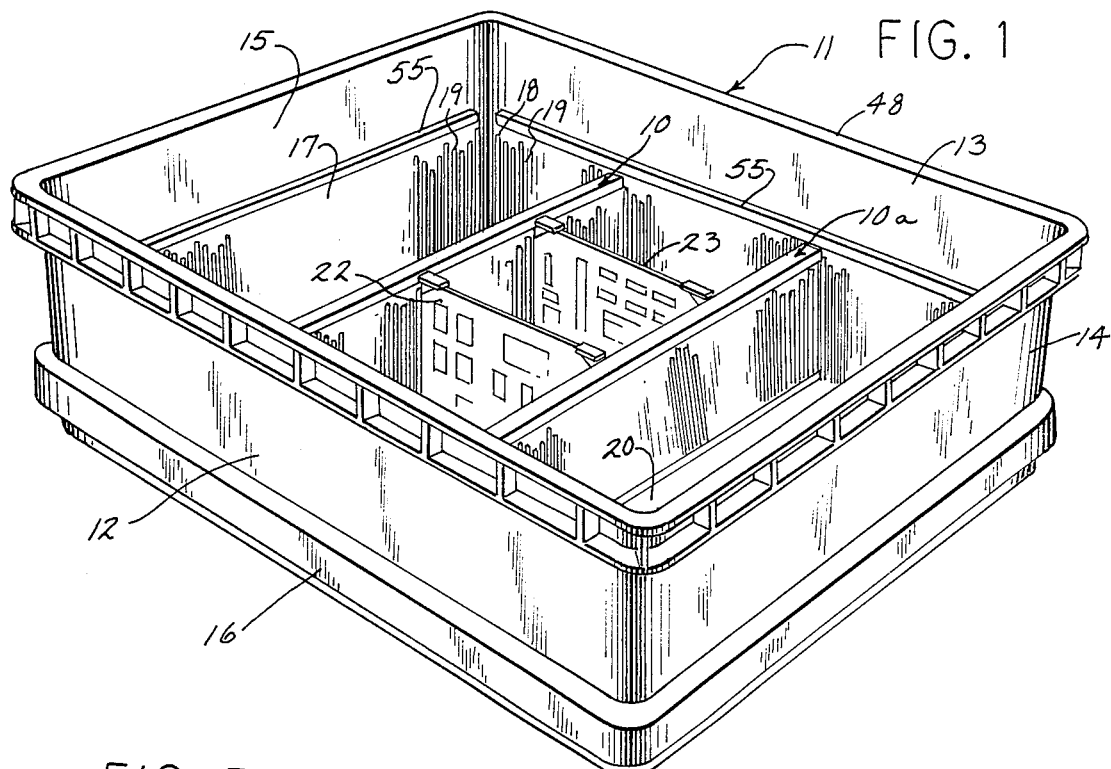
FIG. 1 is a top perspective view of the holder showing two holder devices as they are positioned in a tote box and holding two printed circuit boards.

Proceeding to a detailed description of the two embodiments of the present invention, the circuit board holder includes two holder devices generally 10 and 10a which are shown in FIG. 1 positioned in a tote box generally 11 for holding circuit boards 22 and 23 therebetween. The tote box 11 in this instance has the usual front wall 12, back wall 13, side walls 14 and 15 as well as a bottom wall 20. It also has a bumper rim 16 and an upper rim 48. This particular tote box constitutes the subject matter of U.S. Pat. No. 4,499,997, which is commonly assigned.

Figure 2:
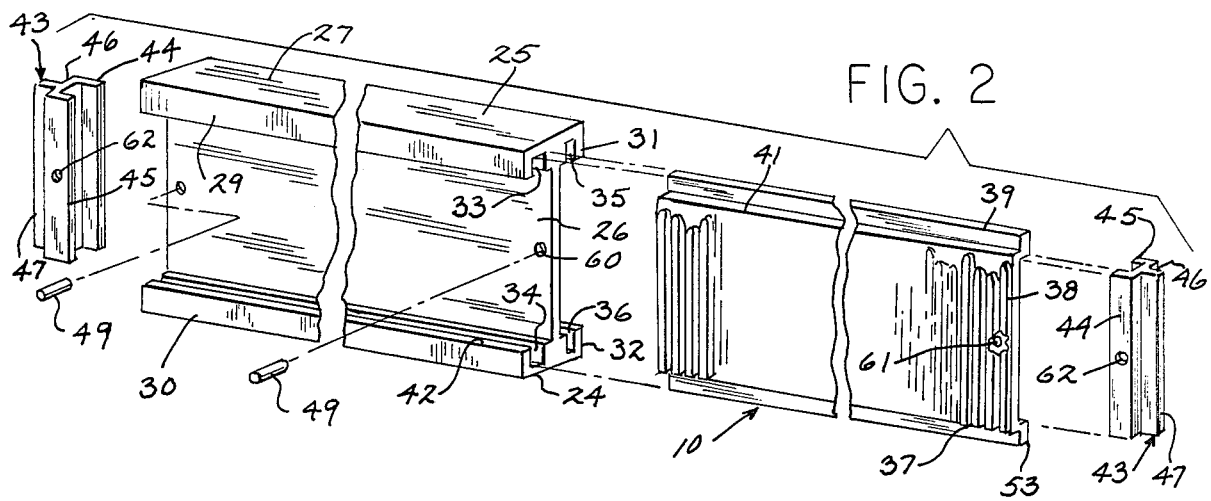
FIG. 2 is an assembly view of one of the printed circuit board holder devices as well as the prepositioning of connectors at the ends thereof.

As best seen in FIG. 2, the holder device 10 includes a holder or frame member 25 having a panel section 26 and the opposing top and bottom walls 27 and 24. The flange portions 29 and 31 extend outwardly from the panel section 26 to provide the tracks or grooves 33 and 35 at the top and the flanges 30 and 32 are spaced from panel section 26 to provide the tracks or grooves 34 and 36 at the bottom thereof. The top track 33 is paired with the bottom track 34 so as to receive a printed circuit board holder 37 having a slotted face panel 38. This is afforded by the opposing, inset flanges 39 and 53 for slidable engagement in the track members 33 and 34. It is noted in this regard that there are ledges 41 which extend inwardly from the face panel 38 and between it and the inset flanges 39 and 53. These ledges ride over the edges such as 42 of the flanges 29 and 30 so that the face panel 38 is coplanar with the outside surfaces of the flanges 29 and 30. Two flanged end connectors generally 43 are positioned at the opposing ends of the holder member 25 with the flanges 47 extending therefrom. Connectors 43 also have the opposing flanges 44 and 45 joined by a base wall 46 from which also extends the flange 47 resulting in a Y-shaped connector 43. These connectors 43 are joined to the frame member 25 by the pins 49 which pass through the openings 62 in the flanges 44 and 45 of the connectors 43 as well as openings one of which is shown at 61 in the face panel 38. In addition, openings 60 are provided in the panel section 26 to receive the pins 49 when the facing board panel 38 is placed in the tracks or grooves 33 and 34 and another similar facing board panel 50 is placed in tracks 35 and 36. The flanges 44 and 45 of the connectors 43 are positioned between the facing board panels 38 and 50 as will be later described in conjunction with FIG. 4.

Figure 3:
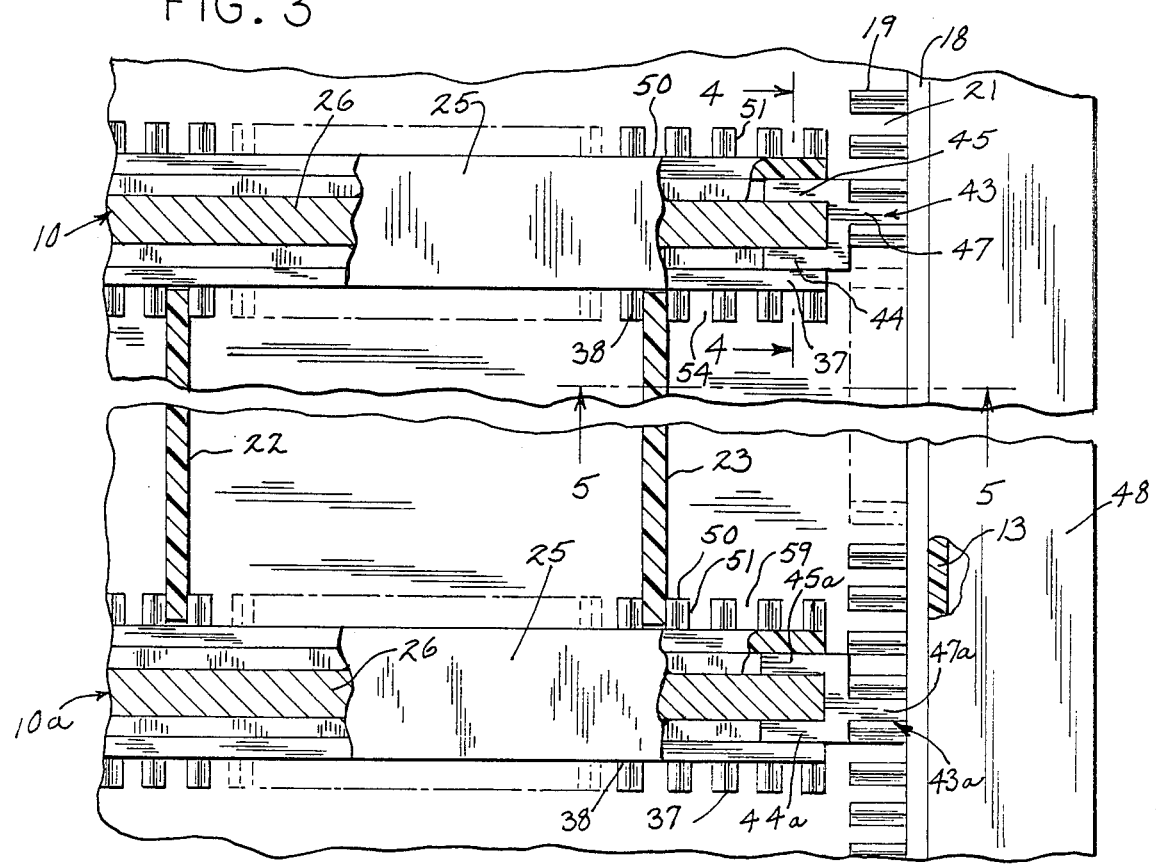
FIG. 3 is a top plan, partial view and partially in horizontal section illustrating the holder as it is seen in FIG. 1.

As indicated in FIG. 3, each of the holding devices generally 10 and 10a preferably has two circuit board holders 37 and 50 disposed on opposite sides of the panel section 26 of the holder members 25. The circuit board holder member 50 is the same as holder 37 and also has a slotted face panel 51 similar to face panel 38. This is also seen in conjunction with FIG. 4. Referring to both FIGS. 1 and 3, slotted holder faces 17 and 18 are secured to front 12, back 13, and side walls 14, 16 of the tote box 11 preferably by sonic welding. They have upper rails such as 55 and the slots 21 receive the flanges 47 and 47a of the connectors 43 and 43a. It is further seen that connector 43a has the opposing flanges 44a and 45a for connection to the holder 25. The circuit boards 22 and 23 are positioned between the circuit board holders 37 and 50 and in the respective slots 54 and 59.

Figure 4:
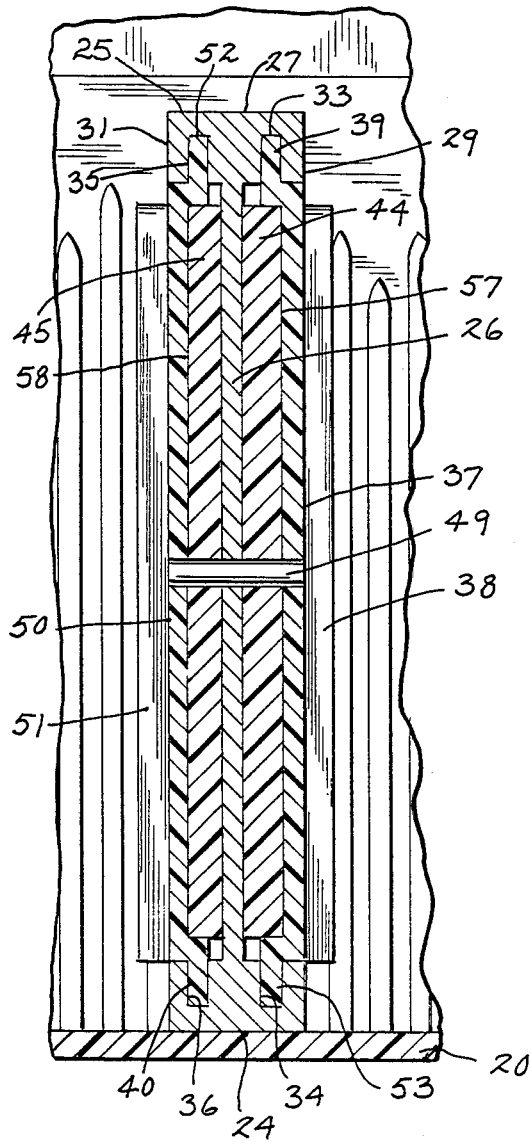
FIG. 4 is a view in vertical section taken along line 4—4 of FIG. 3.

Referring to FIG. 4, it is seen that there are cavity portions 57 and 58 provided between the holder faces 38 and 51 and the panel section 26. These cavity portions 57 and 58 accommodate the flanges 44 and 45 of the connectors 43 when they are joined to the holder member 25 by the pin 49. The circuit board holders 37 and 50 have the inset flanges 39, 53 and 52, 40 positioned in the respective tracks 33, 34, 35 and 36.

Figure 5:
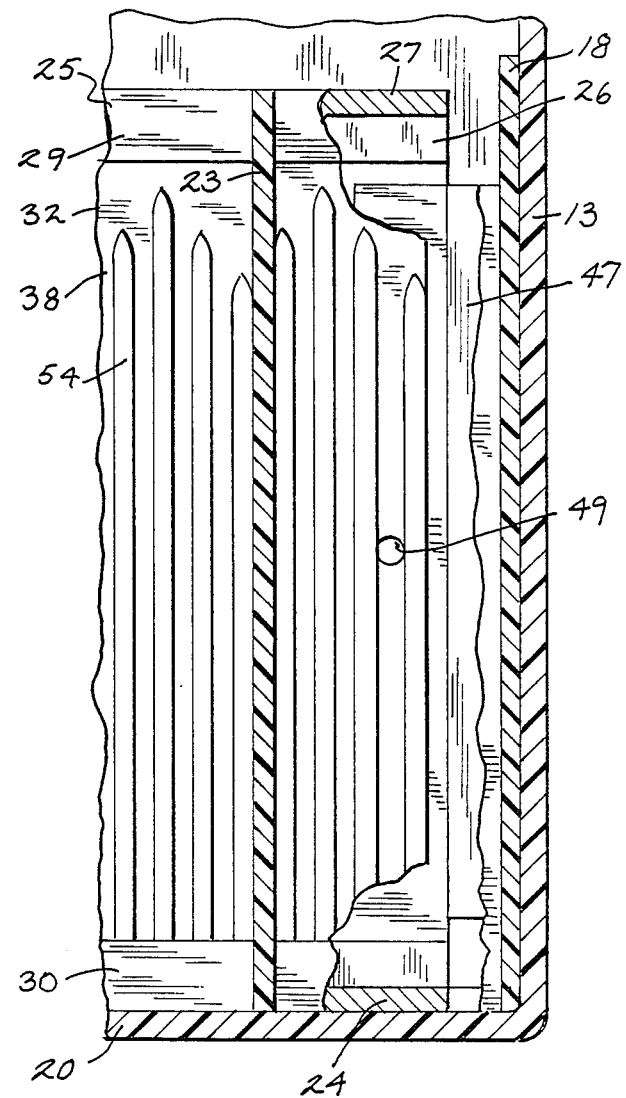
FIG. 5 is a view in vertical section taken along line 5—5 of FIG. 3.

Referring specifically to FIG. 5, the circuit board holder face 38 has the slots 54 for accommodating circuit board 23. Similarly, circuit board face panel 51 also has the slots 59 for accommodating the opposite end of the circuit board 23. (See FIG. 3.) It is seen that the circuit board 23 while being positioned in the slots such as 54 and 59 extends and rests on the bottom wall 20 of the box 11.

Referring back to FIG. 3, it is seen that the connectors 43 and 43a have the flanges 47 and 47a offset with respect to the walls 44, 44a and 45, 45a, respectively. This affords an adjustment feature when the holder devices 10 and 10a are turned end-to-end. Actually connectors 43 and 43a are the same except for positioning.

Figure 6:
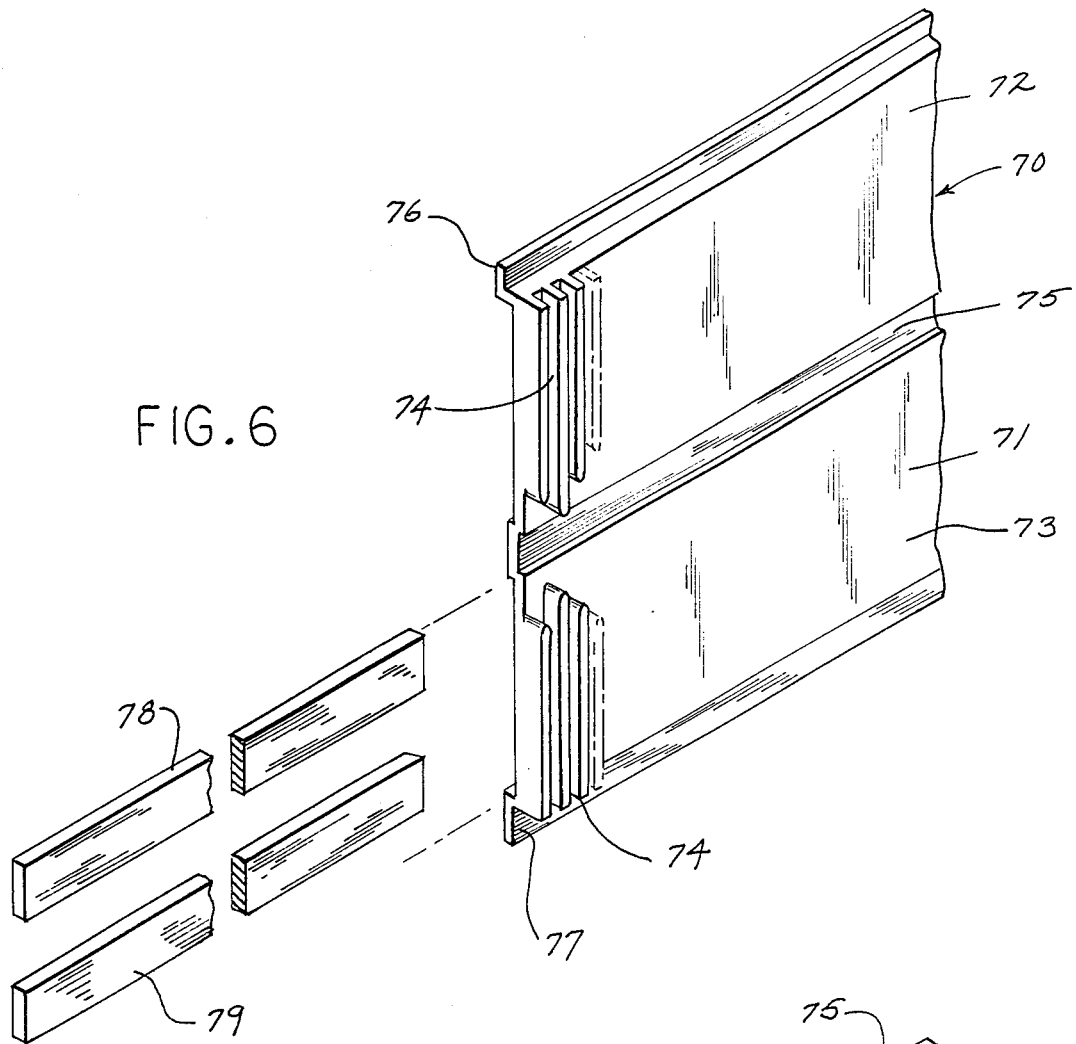
FIG. 6 is an assembly view of the preferred alternative embodiment of the circuit board holder member.

A preferred alternative embodiment of the circuit board holder device generally 70 is shown in FIGS. 6–10. Referring specifically to FIG. 6, it will be seen that the holder device 70 is formed from a unitary facing panel 71 which will have opposing facing panels 72 and 73. These are joined by a common hinge 75. Disposed on facing panels 72 and 73 are the usual slots 74 for receiving the printed circuit boards 22 and 23. Extending oppositely from the hinge 75 are the tab portions 76 and 77. Shown in conjunction with the unitary facing board 70 are two bars 78 and 79 which preferably are formed from aluminum bar stock.

Figure 7:
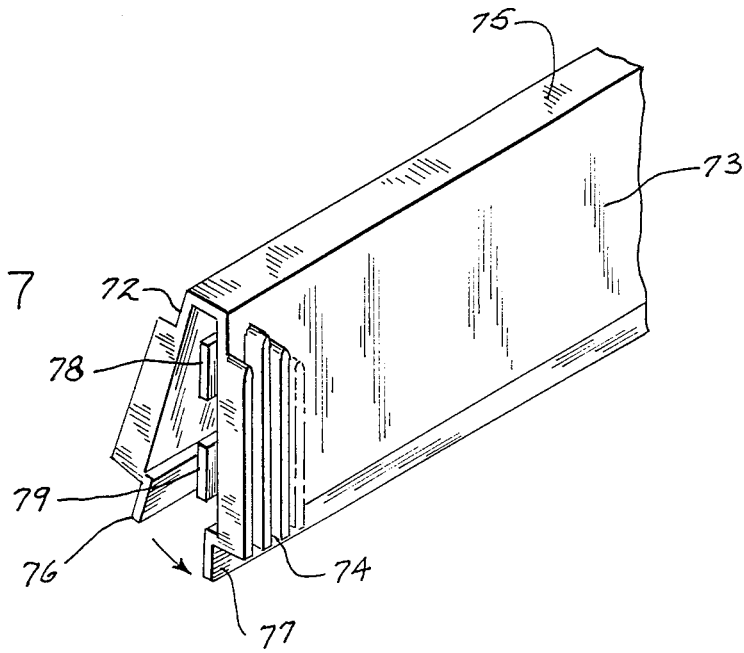
FIG. 7 is a view similar to FIG. 6 except showing the circuit board holder member in a further state of assembly.
Figure 8:
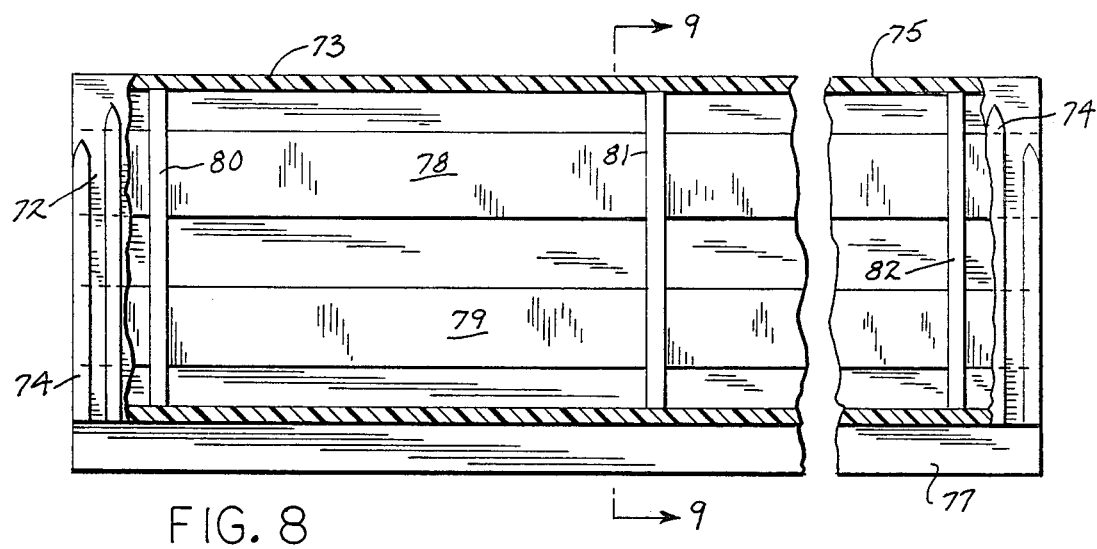
FIG. 8 is a partial view of the circuit board holder member in side elevation and with a portion broken away illustrating another fabrication step.
Figure 10:
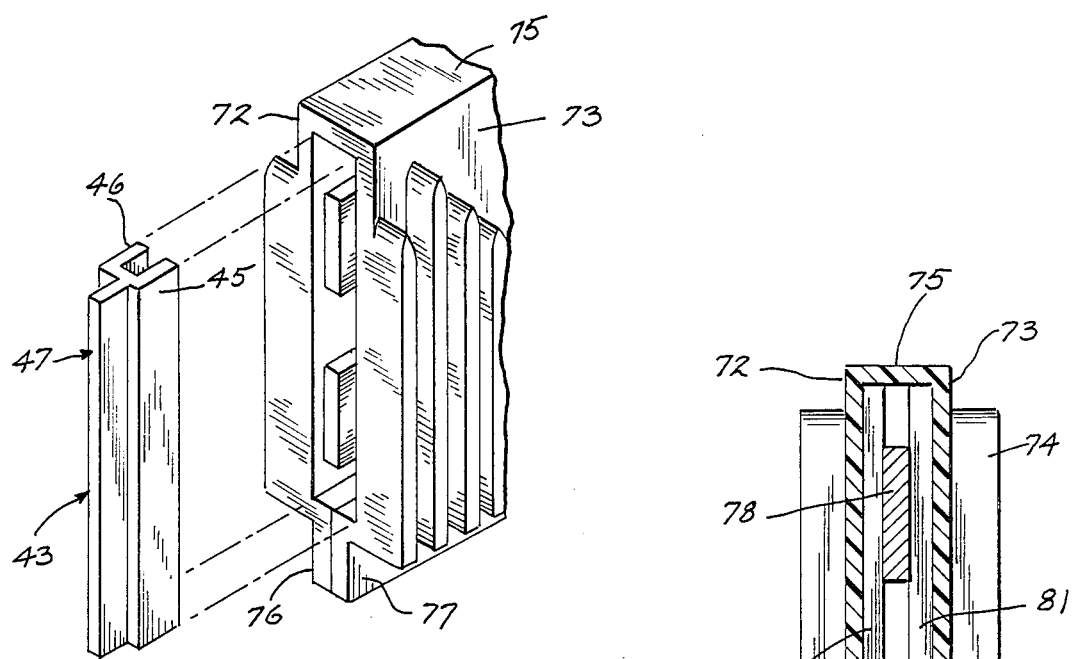
FIG. 10 is a partial perspective view showing still another stage of the assembly of a holder device shown in FIGS. 6–8.
Figure 9:
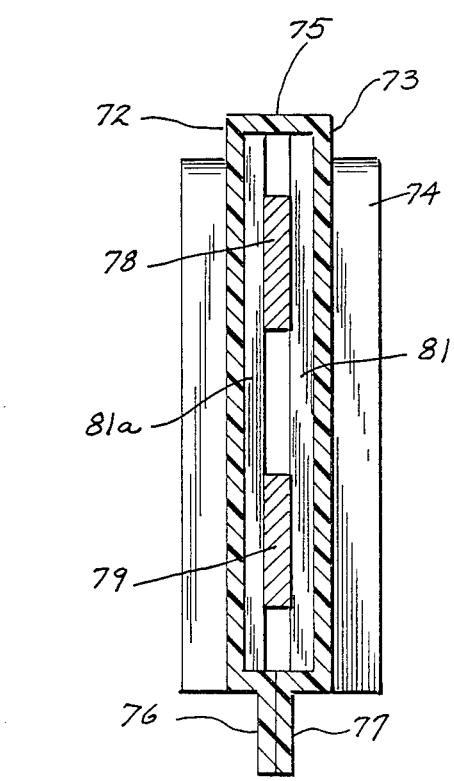
FIG. 9 is a view in vertical section taken along line 9—9 of FIG. 8.

FIG. 7 illustrates the next stage of assemblying the device 70. It will be seen that facing panels 72 and 73 are brought into parallel alignment with the bars 78 and 79 spaced therebetween. These will serve as reinforcing means for the holder device 70. Referring to FIGS. 8 and 9, the inside wall surfaces of the facing panels 72 and 73 will have the paired ribs 80, 81, 81a and 82. These will provide an attachment surfaces for the bars 78 and 79. Preferably, the bars 78 and 79 will be connected thereto such as by sonic welding. The next fabrication step is illustrated in FIG. 9. There it will be seen that the tab portions 76 and 77 are joined together such as by sonic welding. This will result in the facing panels 72 and 73 being formed in parallel alignment with the bars 78 and 79 extending in the inside thereof. As indicated, the bars 78 and 79 have secured to the opposing sides thereof the ribs 81 and 81a which as indicated are preferably disposed in pairs and extend from inside the facing panels 72 and 73. The last step in assembly is the placement of connector 43 which will provide an end cap. The flanges 44 and 45 will be inserted to the inside of the facing panels 72 and 73 and sonically welded therein. In this instance it is noted that the ends of the bars 78 and 79 are recessed so as to accommodate the flanges 44 and 45. The holder device 70 is employed in the manner previously described for holder devices 10 and 10a. It has all the previously indicated advantages of the holder devices 10 and 10a. The holder device 70 not only acts as a divider and holder for the circuit boards 22 and 23 but by having slots on both sides of the divider holder, the circuit boards can be accommodated on both sides thereof. It also has the adjustability feature due to the offset flange 47 of the connector 43 with respect to the center line of the panel 71. The major advantage of the holder device 70 over devices 10 and 10a is its cost in fabrication.

The holder devices 10, 10a and 70 of this invention are versatile in that they can act as a divider in a tote box to accept board holder face panels of varying slots and configurations. Neither is it necessary that each of the holder devices have circuit board holders on both sides. If it is desired, only one printed circuit board holder needs to be placed in the holder member on one side thereof. Also, while it is preferable to have connectors 43 as separate components which are connected to the holder member 25, a flange portion could extend from the holder member 25 and be integral therewith. Preferably, the circuit board holders 37 and 50 are coextensive with the holder member 25 and the flanges 44 and 45 are inserted into the cavity portions 57 and 58 formed between the holder faces 38 and 51 and the panel section 26. Alternatively, the connectors 43 could be accommodated in the tracks 33–36 by dimensioning the circuit board holders 37 and 50 less than the width of the holder member 25.

The holder member 25 is preferably fabricated from aluminum while the circuit board holders 37 and 50 as well as unitary facing board 71 are composed of a polypropylene material. Any lightweight material, whether metal or plastic, could be substituted for these.

It will thus be seen that through the present invention there is now provided a printed circuit board holder which can be readily adapted or fabricated to receive face panels of various configurations. They are also easily adjusted and fitted into a standard container as dividers. The holder can also be easily fabricated to accomplish this purpose. Accordingly, substantial cost savings are effected as well as versatility in design in accommodating various sizes and configurations of a printed circuit board in a holder box as well as on both sides thereof.

While only certain preferred features of the invention have been shown by way of illustration, many modifications and changes will occur to those skilled in the art. It is, therefore, to be understood that the appended claims are intended to cover all of its modifications and changes that fall within the true spirit of the invention.

I claim:

1. A holder device for receiving the ends of circuit board members or the like in a container box having opposing slotted side walls comprising:
    a holder member being of a dimension and having opposing extension portions for positioning in said opposing slotted side walls, said holder member including a slotted facing surface on both sides of said holder member;
    said holder member being defined by a panel section for extension between said opposing slotted side walls with a pair of opposing track members extending between said extension portions of both sides of said panel section, said track members adapted to extend between said opposing slotted side walls and said slotted facing surface is defined by a circuit board holding member constructed and arranged to be positioned in said track members.

2. The invention according to claim 1 wherein said track members are defined by opposing grooves provided by wall portions extending transversely with respect to said panel section and flange portions extending from said wall portions and spaced from said panel section.

3. The invention according to claim 1 wherein said extension portions are defined by separate interconnecting flanged members.

4. The invention according to claim 3 wherein said flanged members are defined by projecting walls for engagement with said holder member and an opposing wall flange offset with respect to said projecting walls.

5. The invention according to claim 4 wherein said projecting walls are constructed and arranged to fit between said slotted facing surface and said projecting walls and said circuit board holding member is secured to said panel section by pin members.

6. A circuit board holder or the like comprising:
    a container box having opposing slotted side walls; and
    at least three holder devices as defined in claim 1 for placement therein.

7. The invention according to claim 6 wherein said opposing slotted side walls are defined by face members adapted to be secured to the side walls of the container box.

* * * * *

UNITED STATES PATENT AND TRADEMARK OFFICE
CERTIFICATE OF CORRECTION

PATENT NO. : 4,763,782

DATED : August 16, 1988

INVENTOR(S) : Sinchok

It is certified that error appears in the above-identified patent and that said Letters Patent is hereby corrected as shown below:

Column 6, line 12    "of" should read --on--

Signed and Sealed this

Twenty-fourth Day of October, 1989

Attest:

DONALD J. QUIGG

Attesting Officer    Commissioner of Patents and Trademarks